US 6,533,966 B1

(12) United States Patent
Nonninger et al.

(10) Patent No.: US 6,533,966 B1
(45) Date of Patent: Mar. 18, 2003

(54) METHOD FOR PREPARING SUSPENSIONS AND POWDERS BASED IN INDIUM TIN OXIDE AND THE USE THEREOF

(75) Inventors: Ralph Nonninger, Saarbruecken-Buebingen (DE); Christian Goebbert, Saarbruecken (DE); Helmut Schmidt, Saarbruecken-Guedingen (DE); Robert Drumm, Saarbruecken (DE); Stefan Sepeur, Wadgassen-Schaffhausen (DE)

(73) Assignee: Institut für Neue Materialien gem. GmbH, Saarbrücken (DE)

( * ) Notice: Subject to any disclaimer, the term of this patent is extended or adjusted under 35 U.S.C. 154(b) by 0 days.

(21) Appl. No.: 09/763,643

(22) PCT Filed: Sep. 3, 1999

(86) PCT No.: PCT/EP99/06498
§ 371 (c)(1),
(2), (4) Date: Feb. 23, 2001

(87) PCT Pub. No.: WO00/14017
PCT Pub. Date: Mar. 16, 2000

(30) Foreign Application Priority Data

Sep. 6, 1998 (DE) .......................... 198 40 527
Oct. 23, 1998 (DE) .......................... 198 49 048

(51) Int. Cl.⁷ .................. H01B 1/02; B32B 5/16; B28B 1/00; C01G 19/02; C01G 15/00
(52) U.S. Cl. ............... 252/520.1; 252/520.1; 428/328; 264/614; 264/621; 423/89; 423/111; 423/115; 423/618; 423/624
(58) Field of Search ........... 252/520.1; 428/328; 264/614, 621; 423/89, 111, 115, 618, 624; 106/1.12, 1.22

(56) References Cited

U.S. PATENT DOCUMENTS 5,401,441 A * 3/1995 Robert et al. ............ 252/520.1
5,518,810 A * 5/1996 Nishihara et al. ........... 428/328
5,700,419 A * 12/1997 Matsunaga et al. ......... 264/614

FOREIGN PATENT DOCUMENTS

EP   0 578 584 A1   1/1994
JP   06049394   *  2/1994   ............ C09K/3/00
JP   08041441   *  2/1996   ............ C09K/3/00

OTHER PUBLICATIONS

Goebbert et al., "Transparent conductive coatings made from redispersible crystalline nanoscaled powders", *Mat. Res. Soc. Symp. Proc.*, 574, 199–204 (1999).

* cited by examiner

Primary Examiner—Mark Kopec
Assistant Examiner—Kallambella Vijayakumar
(74) Attorney, Agent, or Firm—Heller Ehrman White & McAuliffe LLP

(57) ABSTRACT

Suspensions and powders based on indium tin oxide are prepared by a method in which indium tin oxide precursors are precipitated from solutions in one or more solvents in the presence of one or more surface-modifying components, the solvent(s) are removed from the precipitate, which is then calcined, one or more surface-modifying components and one or more solvents are added, the mixture is comminuted or dispersed to form a suspension, and the liquid components are separated from the suspension to give a powder. The powder may be converted into a moulding by a shaping process. The materials prepared by this method are especially suitable as coating materials for use in microelectronics and optoelectronics.

13 Claims, 1 Drawing Sheet

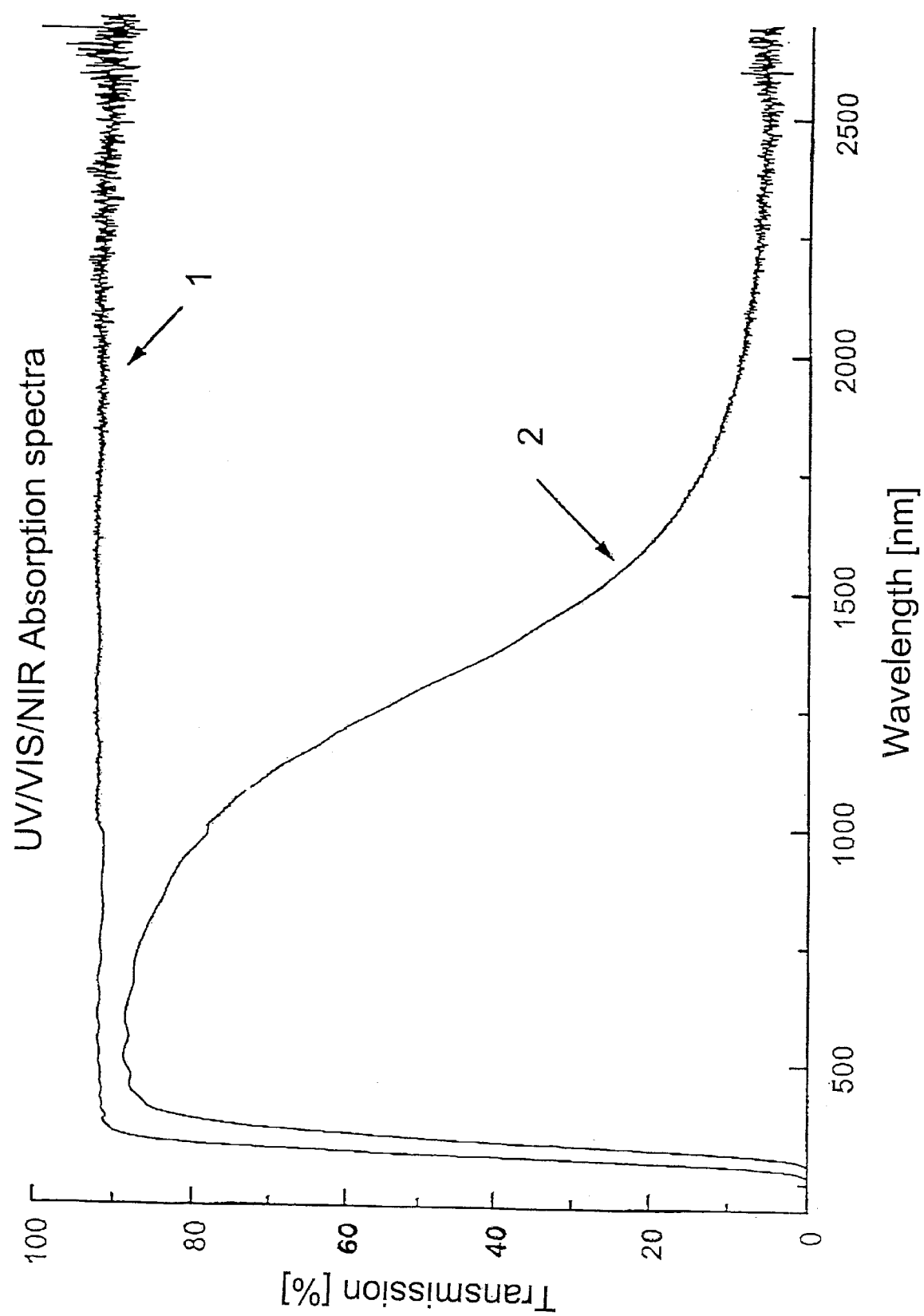

METHOD FOR PREPARING SUSPENSIONS AND POWDERS BASED IN INDIUM TIN OXIDE AND THE USE THEREOF

CROSS-REFERENCE TO RELATED APPLICATIONS

This application is a 371 of International Application No. PCT/EP99/06498, filed Sep. 3, 1999, which in turn claims the priority of German Applications Nos. 198 40 527.8, filed Sep. 6, 1998, and 198 49 048.8, filed Oct. 23, 1998.

BACKGROUND OF THE INVENTION

(1) Field of the Invention

The invention relates to suspensions and powders based on indium tin oxide, methods of preparing them, mouldings produced from them, and also coating and moulding compositions and the use thereof as coating materials.

(2) Description of Related Art

Optoelectronic properties are a characteristic of indium tin oxides. In the form of thin transparent layers, for example, the oxides are able to reflect infrared light and at the same time combine a relatively high electronic conductivity with transparency in layer systems. For this reason, there are a very large number of possible uses for indium tin oxide (ITO) systems, and, accordingly, there have also been a very large number of investigations into their preparation.

The most common methods of applying transparent layers are gas phase techniques, in which the ITO is deposited from the gas phase onto the substrate in the form of a thin coherent layer. Other methods used include the sol-gel process, or powder and paste technologies.

A characteristic of the indium-oxygen system is the large number of compounds. The most thermodynamically stable is $In_2O_3$. Indium oxides of composition $In_4O_3$, $In_4O_5$, $In_2O$ and $In_7O_9$ are usually formed by reduction of $In_2O_3$ in a stream of hydrogen. At room temperature, $In_2O_3$ is dark yellow to pale yellow, at higher temperatures it is brown to brownish red, and it is soluble in mineral acids. Only the cubic modification can be detected by rontgenography.

For the preparation of pure indium oxide powders, the literature describes predominantly precipitation from solutions. The chosen hydroxides are subsequently converted into the oxides by calcining. Aqueous salt solutions are precipitated with alkali metal solutions, with ammonia or with urea; see, for example, JP 06227815 A2, JP 05193939 A2, JP 04325415 A2, JP 04219315 A2 and DE 2127135 A.

Occasionally, precipitation is also carried out in the presence of sulphuric acid or sulphate solutions; see, for example, JP 05058627 A2. However, no information is given on the effect of the precipitate on the quality of the powder. Additionally, the information given by the literature regarding particle size or agglomeration state, if given at all, is very imprecise. The particle sizes, which are generally calculated back from the measurement of the BET surface area of the powders, extend from the nanometer range up into the region of 100 $\mu$m.

Indium oxide is a wide-gap n-semiconductor whose intrinsic electronic conduction derives from oxygen defects. Besides intracrystalline effects, the mobility of the charge carriers is restricted in particular by the hindrance of intercrystalline electron transitions. One possibility for increasing the low charge carrier density of plain indium oxide is the specific incorporation of tetravalent elements such as, for example, tin.

Various ways of preparing indium oxide/tin oxide mixtures are known. In the case of the simple mixed oxide method of preparing ITO mixtures, temperatures between 700° C. and 900° C. are required; see, for example, EP 654447 A1. The sol-gel technique is suitable likewise for preparing ITO mixtures, with specific powder surface areas of 10 $m^2/g$ being indicated; see, for example, JP 06293517 A, JP 06080422 A and JP 05201731 A. There are also descriptions of electrolysis methods, in which anodic oxidation of an indium electrode or of an indium tin electrode produces hydroxides, which are converted into oxides by subsequent calcining; see JP 63195101 A2, JP 06171937 A2 and JP 06329415 A2. Furthermore, indium tin hydroxides are dispersed in organic solvents, dehydrogenated by azeotropic distillation, and then converted into the oxides by drying and calcining; see JP 02006332 A2. ITO powders may also be prepared by an arc discharge between a tungsten electrode and an indium electrode in an argon/oxygen mixture (Y. Endo et al., Funtai, Kogaku Kaishi (1995), 32 (12), 874–80) or by means of aerosol spray pyrolysis of indium acetate in water in an argon carrier gas (D. M. Speckmann et al., Mater. Res. Soc. Symp. Roc. (1995), 372 (Hollow and Solid Spheres and Microspheres; Science and Technology Associated with Their Fabrication and Application), 247–52, or by spraying indium tin salt solutions at 800° C. (JP 01087519 A). Indium oxide or tin oxide may likewise be prepared by condensing indium chloride and tin chloride from the gas phase followed by reactions with oxygen or water (JP 05024836 A2), and by corona discharge in a reductive atmosphere at 1000° C. (DE 4407774 C1).

To prepare ITO layers, ITO powders are used directly, for example. For example, JP 07118840 A uses an ITO powder having a specific surface area of 30 $m^2/g$, JP 06049394 A an ITO powder having a diameter of 200 nm, and JP 05036314 A an ITO powder having an average particle size of 30 nm.

All in all, this means that there are a large number of preparation methods for tin-doped indium oxide (ITO) powders. Defined information regarding powder qualities in conjunction with their mode of preparation, however, is not described. The quality of the powders used is normally defined by way of the application. In recent years, there has been a sharp increase in interest in a defined preparation and application of transparent conductive layers on various substrates. Whereas the use of Sb- and F-doped tin oxide layers on glass substrates has been known for some time on the basis of their conductivity, their transparency in the visible spectral range and their reflection properties in the IR range, for the surface heating of glasses for aircraft, spaceships and cameras and also for electrostatic shielding purposes, diverse requirements have recently come about regarding such layers for uses in microelectronics and optoelectronics. Examples of such uses include 1. transparent driver electrodes for liquid crystal displays, thin-film electroluminescent displays and electrochromic displays
2. transparent conductive layers for highly sensitive radiation detectors, ferroelectric photoconductors and memory systems
3. transparent conductive oxide films as gate electrodes for charge, injection and charge-coupled systems.

These uses in optoelectronics are at the same time tied to more stringent requirements regarding conductivity, transparency and structurability of the layers. Because of the unfavouring structuring properties of doped tin oxide layers in connection with customary structuring by chemical etching technologies, it is predominantly tin-doped indium oxide layers (ITO) which have become established for these uses.

Furthermore, these ITO layers have a significantly better conductivity and transparency than doped tin oxide layers. Tin-doped indium oxide layers are currently the most conductive coatings available commercially. In routine operations, the specific resistance which can be achieved is approximately $1-2\times10^{-4}$ ohm.cm, which in conjunction with an approximately 30 nm thick barrier layer of $SiO_2$ leads to a surface resistance of 15 Ω/□ at a layer thickness of just 120 nm (transparency >90%). Because of preparation by sputtering or CVD techniques, the costs for this type of coating are comparatively high, and extensive coatings are difficult to implement.

The high charge carrier density in conjunction with a charge carrier mobility in the range of 40–60 $cm^2$/Vs leads to very high transparency in the visible region with outstanding reflection in the IR region at the same time. The fraction of tin oxide is usually between 7–12% by weight.

For many applications, especially in microelectronics and optoelectronics, with optical and IR-blocking coatings it is important to use ITO powders comprising nanoscale particles. Such nanoscale particles have an average particle size of preferably not more than 200 nm, in particular not more than 50 nm, and with particular preference not more than 30 nm. A particularly preferred range is from 5 to 30 nm.

In many methods of preparing indium tin oxide powders or suspensions, suspensions of precursors of the indium tin oxide powder are obtained from which the indium tin oxide powders, after drying, are prepared by calcining. The particle sizes of the powders thus prepared, however, are not within the desired nm range, and the powders also cannot be reprocessed to suspensions having particle sizes in the nm range (nanoscale particles), so that with low-viscosity suspensions prepared in this way it is not possible to use dipping, spraying or similar processes to produce coatings having particle sizes in the nm range.

Although nanoscale primary particles of suitable size are formed during the formation of the ITO powder precursors in suspension under the appropriate conditions, these primary particles undergo aggregation to larger particles in the course of processing, especially in the course of calcining. The reason for this aggregation is that a decrease in particle size is accompanied by the domination, or considerable increase in significance, of weak forces of interaction, such as van der Waals forces, for example. A further factor is that the particle surface is always covered with functional, i.e. condensable, groups which lead to the formation of hard aggregates as a result of condensation reactions between individual primary particles. In that case, the primary particles are connected to one another by way, so to speak, of sintering necks. These aggregates of primary particles can no longer be disrupted by a simple dispersing step in an aqueous or nonaqueous solvent.

Powders of this kind, prepared by calcining, cannot be used for highly transparent layers, since even particles with sizes of 50 nm lead to optical defects.

BRIEF SUMMARY OF THE INVENTION

It was therefore an object of the present invention to prepare compositions based on indium tin oxide in such a way that, despite calcining, nanoscale particles of suitable size are obtained and the powders can be processed in a simple dispersing step to give suspensions, with full retention of the primary particle size.

This is made possible in accordance with the invention by a method of preparing suspensions and powders based on indium tin oxide, characterized in that a) indium tin oxide precursors are precipitated from solutions of indium compounds and tin compounds in one or more solvents in the presence of one or more surface-modifying components, b) the solvent is removed from the resulting powder, which is then calcined, c) one or more surface-modifying components and one or more solvents are added, d) the resulting mixture is subjected to a comminuting or dispersing treatment, with formation of a suspension, and e) any liquid components are separated from the suspension, to give a powder.

Furthermore, it is possible, if desired, to convert the suspension or the powder produced from it into a moulding by way of a shaping process.

The method of the invention results, surprisingly, in suspensions and powders based on indium tin oxide which consist substantially of primary particles and which contain substantially no agglomerates formed by aggregation of primary particles. The powders can easily be redispersed to give suspensions in which the primary particle size is almost fully retained.

BRIEF DESCRIPTION OF THE DRAWING

The FIGURE shows the absorption spectra of glass with an ITO-free layer (line 1) and glass with a layer containing 80% by weight (68% by volume) ITO (line 2).

DETAILED DESCRIPTION OF THE INVENTION

An indium tin oxide powder, also referred to as an ITO powder, is a powder consisting substantially of a mixed oxide of indium and tin. In the powder, the indium and the tin may be in one oxidation stage or in different oxidation states. For example, In(+I) and/or In(+III), and also Sn(+II) and/or Sn(+IV), are present. Sn is preferably present as Sn(+IV). If desired, indium and tin may also be present in part as In(0) or Sn(0). The surface of the particles of the ITO powder also carries the surface-modifying components described hereinbelow.

The ITO powder preferably comprises a tin-doped indium oxide, i.e., the fraction of tin oxide is lower than the fraction of indium oxide. The fraction of tin oxide, based on the indium tin oxide without taking into account the surface-modifying component, is, for example, from 2 to 30 mol %, preferably from 7 to 12 mol %. Without taking into account the surface-modifying component, the ITO powder may be expressed, for example, by the formula $In_{2-y}Sn_yO_3$ where $0 \leq y < 2$, especially $0 \leq y < 1$ (charge excess: $e^-_y$).

Of course, the indium tin oxide powder may include impurities. The acceptable level depends on the intended use. From the reactants, for example, $SO_4^{2-}$, Ca, Co, Cu, Fe, Ni, Pb, Zn, K or Na may be present. By using pure reactants it is possible to reduce $SO_4^{2-}$, Ca, Co, Cu, Fe, Ni, Pb and Zn to below 0.005% by weight and Na and K to below 0.01% by weight. By way of the method it is possible, for example, for $NH_4^+$ and $Cl^-$ to enter the product, which can be removed almost completely depending on the number of wash cycles. Based on the indium tin oxide powder, and taking into account the surface-modifying component, however, the impurities content is less than 5% by weight, preferably less than 1% by weight, and with particular preference less than 0.1% by weight.

In the method of the invention, indium tin oxide precursors are precipitated from solutions of indium compounds and tin compounds in the presence of one or more surface-modifying components comprising one or more solvents.

In the case of the precipitation process or coprecipitation process, the method in question may be any of the methods known for this purpose in accordance with the prior art. The precipitation may be implemented, for example, by way of a sol-gel method, an electrolysis method, a dehydration method or an aerosol spray pyrolysis method, as described above. Preferably, however, the precipitation takes place by a sol-gel method. In the case of a sol-gel method, hydrolysis reactions and condensation reactions which lead to the precipitation of hydroxo(oxo) condensates are induced in the presence of water by adding, for example, bases or acids. In order to precipitate the indium tin oxide precursors it is particularly preferred to use bases, especially primary, secondary, tertiary aliphatic or aromatic amines, tetramethyl-ammonium hydroxide, NaOH, KOH, ammonia, ammonium hydroxide or mixtures thereof. With particular preference, ammonium hydroxide is used for the precipitation.

As the indium compounds and tin compounds it is possible to use all indium and tin compounds from which it is possible to obtain indium tin oxide powders via precipitation and optional subsequent aftertreatment, such as calcining, for example. Naturally, the choice of the indium compounds and tin compounds is guided by the precipitation method used. In the case of electrolysis methods, for example, it is possible to use indium electrodes or indium tin electrodes, and in the case of dehydration processes, it is possible to use indium tin hydroxides as indium compounds and tin compounds.

Preferred indium compounds and tin compounds, especially in the case of sol-gel precipitation methods, are indium chloride, indium iodide, indium nitrate, indium acetate, indium sulphate, indium alkoxides, such as indium methoxide or indium ethoxide, or mixtures thereof, and tin chloride, tin sulphate, tin alkoxides, such as tin methoxide or tin ethoxide, or mixtures thereof, tin being present in an oxidation state of +2 or +4 and indium in an oxidation state of +3 or else, in the case of chloride and iodide, in an oxidation state of +1.

The indium tin oxide precursors substantially comprise hydroxy(oxy)condensates of indium and tin.

The indium compounds and tin compounds are coprecipitated from one of more solvents. The indium compounds and tin compounds are preferably completely in solution in the solvent or solvents. Solvents used are preferably water and/or organic solvents. A particularly preferred solvent is distilled (pure) water. Suitable organic solvents include both polar and nonpolar and aprotic solvents. Examples thereof are alcohols, such as aliphatic alcohols having 1 to 6 carbon atoms (especially methanol, ethanol, n- and i-propanol and butanol); ketones, such as acetone and butanone; esters, such as ethyl acetate; ethers, such as diethyl ether, tetrahydrofuran and tetrahydropyran; amides, such as dimethylacetamide and dimethyl-formamide; sulphoxides and sulphones, such as sulpholane and dimethyl sulphoxide; and aliphatic. hydrocarbons (optionally halogenated), such as pentane, hexane and cyclohexane, for example. It is of course also possible to use mixtures of such solvents.

The solvent used preferably has a boiling point which permits easy removal thereof by distillation (under reduced pressure if appropriate). Preference is given to solvents having a boiling point below 200° C., in particular below 150° C.

The precipitation takes place in the presence of surface-modifying components. The surface-modifying component or components may, for example, comprise short-chain organic molecules. Compounds of this kind preferably have not more than a total of 24, in particular not more than a total of 18, and with particular preference not more than 12 carbon atoms. The attachment to the surface of the primary particles which form may be by way, for example, of a covalent or ionic bond and/or by way of polar (dipole-dipole interaction) or van der Waals forces. Preferably, the surface-modifying components contain one or more functional groups. The functional groups carried by these compounds are guided primarily by the surface groups of the resulting ITO powder and, furthermore, by the desired interaction. Examples of preferred functional groups are carboxylic acid groups, acid amide groups, (primary, secondary and tertiary) amino groups, hydroxyl groups and C—H-acidic groups, such as in β-dicarbonyl compounds. It is also possible for two or more of these groups to be present simultaneously in. one molecule (betaines, amino acids, EDTA, etc.).

Accordingly, examples of the surface-modifying components are saturated or unsaturated monocarboxylic and polycarboxylic acids (preferably monocarboxylic acids) having 1 to 24 carbon atoms.

Examples of further suitable surface-modifying components are monoamines and polyamines, especially those of the general formula $R_{3-n}NH_n$, in which n is 0, 1 or 2 and the radicals R independently of one another are alkyl groups having 1 to 12, in particular 1 to 6 and, with particular preference, 1 to 4 carbon atoms (e.g. methyl, ethyl, n- and i-propyl and butyl) and polyethylenamines; β-dicarbonyl compounds having 4 to 12, especially 5 to 8 carbon atoms; organoalkoxy-silanes, such as those used for surface modification of colloidal silica (e.g. those of the general formula $R_{4-m}Si(OR')_m$, in which the groups R and R' independently of one another are $C_1$–$C_4$ alkyl and m is 1, 2, 3 or 4); and modified alkoxides in which some of the OR groups (R as defined above) have been substituted by inert organic groups, attachment (condensation) to the particle surface takes place by way of the remaining OR groups, and the organic groups take over the shielding function. Examples thereof are zirconium and titanium alkoxides $M(OR)_4$ (M=Ti, Zr), in which some of the OR groups have been replaced by a complexing agent, such as a β-dicarbonyl compound or a (mono)carboxylic acid, for example.

A further group of surface-modifying components which can be used comprises surfactants, examples being cationic, anionic, nonionic and amphoteric surfactants. Preference is given to nonionic surfactants, with polyethylene oxide derivatives being particularly preferred. These may be, for example, derivatives with saturated or unsaturated (mono) carboxylic acids, especially with carboxylic acids having more than 7, preferably more than 11 carbon atoms, for example polyethylene oxide derivatives with stearic, palmitic or oleic acid, such as the products obtainable under the trade mark "Emulsogen". They may also be derivatives with sorbitan esters (sorbitan+carboxylic acid), examples of suitable carboxylic acid being those mentioned above. These products are available commercially under the trade mark "Tween". Further, it is possible to use polyethylene oxide (mono)alkyl ethers, for example with alcohols having more than 7, preferably more than 11 carbon atoms, examples being the products available under the trade mark "Brij".

Specific examples of surface-modifying components which can be used are a. monocarboxylic and polycarboxylic acids such as formic acid, acetic acid, propionic acid, butyric acid, pentanoic acid, hexanoic acid, acrylic acid, methacrylic acid, crotonic acid, citric acid, adipic acid, succinic acid, glutaric acid, oxalic acid, maleic acid, fumaric acid, itaconic acid, stearic acid and, in particular, 3,6,9-trioxadecanoic acid and also the corresponding anhydrides, b. diketones such as acetylacetone, 2,4-hexanedione, 3,5-heptanedione, acetoacetic acid, acetoacetic acid $C_1$–$C_4$ alkyl esters such as ethyl acetoacetate, biacetyl and acetonylacetone, c. amino acids, especially β-alanine, and also glycine, valine, aminocaproic acid, leucine and isoleucine, d. polyethylene oxide derivatives, especially Tween® 80 (sorbitan monooleate-polyoxyalkylene), and also Emulsogen® (hexaglycol monostearate), Emulsogen® OG (oleic acid derivative) and Brij® 30 (polyoxyethylene lauryl ether), e. acid amides, especially caprolactam, and f. amines such as, for example, methylamine, dimethylamine, trimethylamine, aniline, N-methyl-aniline, diphenylamine, triphenylamine, toluidine, ethylenediamine and diethylenetriamine.

These surface-modifying components may be used individually or as a mixture. Particularly preferred compounds are 3,6,9-trioxadecanoic acid, β-alanine, Tween® 80 and caprolactam.

The fraction of the surface-modifying component(s), based on the ITO powder, is preferably between 2 and 30% by weight, with particular preference between 2 and 6% by weight.

Precipitation in the presence of the surface-modifying component(s) takes place preferably at a temperature from room temperature (20° C.) up to the boiling temperature of the solvent. Particular preference is given to temperatures in the range from 20 to 100° C. The surface-modifying components are usually fully or partly attached to the surface of the indium tin oxide powder particles which form. Without being tied to any theory, it is assumed that the surface-modifying components, following removal of the solvent and following calcining, are able to remain at least in part on the surface of the powder particles. It is also possible, however, that the surface-modifying components are no longer present in the end product.

Subsequently, the solvent is removed by means, for example, of filtration, evaporation and/or centrifugation and, if desired, drying, for example under vacuum and/or at elevated temperature (e.g. at temperatures up to 250° C. or up to 200° C.) or by freeze drying. The resulting powder normally comprises particles of an indium tin oxide/hydroxide mixture, which particles may have undergone surface modification.

The powder obtained is then calcined. Preferably, this is carried out in an oven. Calcining takes place, for example, at temperatures between 200 and 400° C., preferably between 230 and 280° C., with particular preference 250° C. The isothermal holding time is, for example, between 15 and 120 min, preferably between 45 and 90 min, with particular preference 60 min.

Calcining is preferably carried out under reducing conditions, again using the process conditions referred to above. The reducing conditions are preferably obtained by passing a reducing gas/gas mixture or a reducing vapour through the system. Prior to the introduction of the reducing component, the oven may be flushed with an inert gas, e.g. nitrogen. As the reducing gas/gas mixture or reducing vapour it is possible, for example, to use carbon monoxide, carbon monoxide/nitrogen, a water vapour atmosphere, or forming gas (hydrogen/nitrogen). The use of forming gas is particularly preferred. The gas flow rate used depends on the amount of the powder to be calcined and the reducing component.

If the powder has not been calcined under reducing conditions, the reduction may also be carried out after calcining, for example by sintering the powder or moulding under reducing conditions. In that case, reduction can again be carried out using the abovementioned gases/gas mixtures or vapours.

Despite the use of surface-modifying components, the calcined, optionally reduced powder can in this form still be converted incompletely into a suspension with a primary particle size which is usually in the lower nm range, by means of simple dispersion.

In accordance with the invention, the calcined powder is subjected to a comminuting or dispersing treatment with the addition of further surface-modifying components and one or more solvents. The comminuting or dispersing treatment may take place in any conceivable way; preferably, it is a comminuting treatment. Particular preference is given to mechanical comminuting treatment and/or ultrasonic comminuting treatment.

The mechanical comminution step may be conducted, for example, in mills, extruders or roller beds. Examples of suitable apparatus for the mechanical comminution comprise planetary ball mills, stirred ball mills, and especially shear roll extruders, mortar mills and triple-roll mills. The comminution, which may consist, for example, of milling and homogenization, is preferably performed at room temperature. The duration depends on the nature of the mixture and on the comminuting apparatus used.

Comminuting or dispersing is carried out with the addition of one or more surface-modifying components. In principle, these are the same compounds already described above as surface-modifying components for use during the precipitation. In this stage, it is possible to use as surface-modifying components the same compounds which were used during the precipitation. Alternatively, however, different surface-modifying components may be used during the precipitation and during the comminution.

Organic carboxylic acids and their derivatives, such as anhydrides and acid amides, are preferred for use as surface-modifying component during the comminution or dispersion. Reference is made to the examples set out above. Particular preference is given to using 3,6,9-trioxadecanoic acid.

In the comminution or dispersion, the surface-modifying component is preferably added in an amount, based on the indium tin oxide powder used, of from 2 to 30% by weight, with particular preference 2 to 10% by weight.

Comminuting or dispersing is preferably carried out with the addition of one or more solvents. The solvents used may be the same solvents described above for the precipitation step. As solvents it is preferred, however, to use high-boiling liquids. High-boiling liquids in this case are, for example, liquids having a boiling point above 120° C., preferably above 150° C. Preference is given to the use of high-boiling glycols or glycol ethers, examples being ethylene, propylene or butylene glycol or the corresponding dimers, trimers, tetramers, pentamers, or hexamers, and also the corresponding monoethers or diethers, one or both hydroxyl groups having been replaced by, for example, a methoxy, ethoxy, propoxy or butoxy group. Further examples are terpenes, such as terpineol; polyols, such as 2-methyl-2,4-pentanediol; and polyethylene glycols and their ethers, such as diethylene glycol, triethylene glycol, tetraethylene glycol, diethylene glycol diethyl ether, tetraethylene glycol dimethyl ether or diethylene glycol monobutyl ether. Ethylene glycol, diethylene glycol, and diethylene glycol monobutyl ether are used with preference. It is of course also possible to use mixtures of two or more of these solvents, for example in a volume ratio from 2:1 to 1:2.

For the comminution or dispersion, based on the indium tin oxide powder used, the solvent may be added in an amount of from 5 to 150% by weight, preferably from 10 to 100% by weight, with particular preference from 30 to 50% by weight. A particularly preferred ratio of powder to solvent is 75:25. The amount of solvent is preferably chosen so as to give pastelike or highly viscous suspensions.

The ITO suspension thus obtained may be used directly, for example for coating purposes. If desired, further solvent (either that already used or another of the solvents described above) may be added beforehand in order to raise the viscosity.

Binders may be added to the ITO suspension. The resulting coating or moulding compositions may likewise be used as coating material and/or as mouldings. The binders may be added in amounts such as to give, for example, an ITO filling level in the layer of from 1 to 95% by volume, preferably from 5 to 80% by volume. The term ITO filling level in this context refers to the amount of indium tin oxide or indium tin oxide powder, in % by volume based on the overall solids content of the layer obtained following application to a substrate and drying.

As binders it is possible in principle to use all of the inorganic, organically modified inorganic or organic binders, or mixtures thereof, which are known to the person skilled in the art. Examples of organic binders are polyvinyl resins such as polyolefins, PVC, polyvinyl alcohol, polyvinyl esters or polystyrene, acrylic resins such as acrylates or methacrylates, alkyd resins, polyurethane varnishes, urea, melamine, phenolic resin varnishes, or cellulose esters, such as esters of cellulose with acetic acid or butyric acid.

Preferably, the binders comprise inorganic or organically modified inorganic binders. Examples of organically modified inorganic binders are polyorganosiloxanes or silicone varnishes. The polyorganosiloxanes and the silicone varnishes are preferably prepared by the sol-gel method (sol-gel varnish). They are prepared preferably using hydrolysable silanes. The hydrolysable silanes may contain substituents—preferably non-hydrolysable substituents.

The hydrolysable silanes preferably comprise silanes of the general formula $R_nSiX_{4-n}$. The group or groups X, which may be identical or different but are preferably identical, are hydrolysable radicals. The radicals X are preferably selected from halogen atoms (especially chlorine and bromine), alkoxy groups, alkyl carbonyl groups and acyloxy groups, particular preference being given to alkoxy groups, especially $C_{1-4}$ alkoxy groups such as methoxy and ethoxy. n may adopt the values 1, 2 or 3, preferably 1 or 2 and with particular preference 1. The hydrolysable silanes used may also comprise fully hydrolysable silanes of the above formula in which n is 0, preferably in a fraction of less than 50 mol % based on all of the monomeric hydrolysable silanes used.

The group R or the groups R, which may be identical or different, may be alkyl, alkenyl, aryl, alkylaryl, arylalkyl or R'Y. R' is straight-chain or branched alkylene which may be interrupted by oxygen or sulphur atoms or NH groups, or is phenylene, alkylphenylene or alkylenephenylene. Y is the functional group by way of which crosslinking is possible. Examples of Y are unsubstituted or substituted amino, amide, alkyl-carbonyl, unsubstituted or substituted aniline, aldehyde, keto, carboxyl, hydroxyl, alkoxy, alkoxy-carbonyl, mercapto, cyano, hydroxyphenyl, alkyl, carboxylate, sulphonic acid, phosphoric acid, acryloyloxy, methacryloyloxy, methacryloyloxy, glycidyloxy, epoxide, allyl or vinyl groups. Preferably, Y is an acryloyloxy, methacryloyloxy, glycidyloxy, epoxide, hydroxyl or amino group.

In the above formulae, radicals R, R', X and/or Y occurring two or more times may in each case have the same meaning or different meanings in one compound. It is also possible to use mixtures of different hydrolysable silanes.

Instead of the hydrolysable silanes, or (preferably) in a mixture with the hydrolysable silanes, it is also possible in accordance with the invention to use hydrolysable metal compounds, preferably those derived from metals of main groups Ia, IIa, IIIa and IVa and of transition groups IVb, Vb and VIb of the Periodic Table, particular preference being given to compounds of aluminium, titanium and zirconium (e.g. the alkoxides of Al, Ti and/or Zr).

Examples of inorganic binders are silicone varnishes, which are prepared, for example, from hydrolysable silanes having no non-hydrolysable substituents, i.e., for example, compounds of the above formula $R_nSiX_{4-n}$ in which n is 0 and X is as defined above. Instead of or alongside the silanes it is also possible to use metal compounds derived preferably from metals of main groups Ia, IIa, IIIa and IVa and of transition groups IVb, Vb and VIb of the Periodic Table, particular preference being given to compounds of aluminium, titanium and zirconium.

A further example of an inorganic binder that can be employed comprises precipitation products, not fully crystallized, of the abovementioned indium compounds and tin compounds. The compounds, conditions and methods used are the same as those described for the precipitation of the indium tin oxide precursors, except that, preferably, no surface-modifying component is used.

This ITO precipitation product is dried if desired but not calcined, so that it constitutes an incompletely crystallized hydroxy(oxy) product which may have surface hydroxyl groups.

The binders, especially the inorganic and organically modified inorganic binders, may also be used in the form of their monomers or precondensates and may be condensed further after they have been mixed with the ITO powder of the invention or with the ITO suspension of the invention.

The binders may also comprise nanoscale inorganic particulate solids (nanoparticles). The nanoparticles that can be used possess, for example, an average particle size of not more than 200 nm; preferably, the particle size range is below 50 nm. The nanoparticles may be added, for example, in the form of powders or sols.

The nanoscale inorganic particulate solids may consist of any desired materials, but preferably consist of metals and, in particular, of metal compounds such as, for example, (anhydrous or hydrated) oxides such as $ZnO$, $CdO$, $SiO_2$, $TiO_2$, $ZrO_2$, $CeO_2$, $SnO_2$, $Al_2O_3$, $In_2O_3$, $La_2O_3$, $Fe_2O_3$, $Cu_2O$, $Ta_2O_5$, $Nb_2O_5$, $V_2O_5$, $MoO_3$ or $WO_3$; chalcogenides such as, for example, sulphides (e.g. CdS, ZnS, PbS and $Ag_2S$), selenides (e.g. GaSe, CdSe and ZnSe) and tellurides (e.g. ZnTe or CdTe), halides such as AgCl, AgBr, AgI, CuCl, CuBr, $CdI_2$ and $PbI_2$; carbides such as $CdC_2$ or SiC; arsenides such as AlAs, GaAs and GeAs; antimonides such as InSb; nitrides such as BN, AlN, $Si_3N_4$ and $Ti_3N_4$; phosphides such as GaP, InP, $Zn_3P_2$ and $Cd_3P_2$; phosphates, silicates, zirconates, aluminates, stannates and the corresponding mixed oxides (e.g. those with perovskite structure such as $BaTiO_3$ and $PbTiO_3$).

It is also possible to use nanoscale inorganic particulate solids provided with addition-polymerizable and/or polycondensable organic surface groups. Such addition-polymerizable and/or polycondensable nanoparticles and their preparation are described, for example, in DE 197 46 885.

Examples of preferred binders are the fluorine-containing inorganic polycondensates described in DE-A-41 18 184 and, in particular, the polyorgano-siloxanes containing epoxide groups that are described in DE-A-43 38 361.

This mixture, obtained from ITO suspension and binder, may likewise be used as a coating composition and moulding composition for coating purposes, in which case ITO layers are obtained. The coating composition comprising ITO powder and binder may be used to produce transparent, scratch-resistant, IR-absorbing layers on all substrates (including transparent substrates).

At the comminuting or dispersing stage it is also possible, if desired, to add one or more binders in addition. These binders may also be added, for example, as mixtures with the solvents that are used. Examples of binders that can be used have been described above. The implementation of the comminuting or dispersing treatment with the addition of one or more binders is governed by the same conditions described above for the addition of one or more solvents. The amounts of binder used may be such that the above-described filling levels are obtained. In that case, the mixtures obtained may be used directly, for example, as a coating composition for coating purposes. In principle, the binder, provided that it has an appropriate viscosity, may also be used instead of the solvent.

Alternatively, an ITO powder may be obtained from the ITO suspension by removal of the liquid components (e.g. by filtration, evaporation, centrifugation and/or drying). The resulting ITO powder is usually substantially nanocrystalline.

The resulting ITO powder and the ITO suspension and ITO coating and moulding compositions comprise nanoscale crystalline particles of indium tin oxide which consist primarily of primary particles and in which aggregates are virtually absent. By means of the method of the invention it is possible, accordingly, to provide powders, suspensions, mouldings and coating and moulding compositions, based on indium tin oxide, in which the particle size is not more than 200 nm. It is possible in particular to obtain particle sizes of less than 50 or less than 20 nm and even of less than 10 to 11 nm. The particle size is usually above 2 nm, more frequently above 5 nm. Surprisingly, the powders thus obtained may be dispersed to their complete primary particle size without problems in, for example, alcoholic solutions (e.g. ethanol), but also in water, the aforementioned particle size being retained, i.e., the primary particles being retained without the formation of aggregates. For the dispersing of ITO powders it is possible in principle to use all suitable solvents, examples being the solvents described above for the precipitation.

It is possible to keep the indium tin oxide as a powder and to use it as and when required, in the form, for example, alternatively of the powder itself, a suspension, a coating or moulding composition, or a moulding. The term coating and moulding compositions also includes pastes, which are obtained, for example, by reacting the ITO powder with viscous solvents. The abovementioned ITO materials may be used with preference for coating, for example, by means of dipping or spraying techniques.

Mouldings may be produced from the ITO powder by shaping techniques which are known to the person skilled in the art. Examples that may be mentioned include extrusion, slip casting, injection moulding, electrophoresis, film casting or screen printing. Depending on the technique employed, it is also possible to use binders. Examples of suitable binders are those mentioned above. The mouldings produced may be, for example, layers or sintered bodies, especially targets. Targets are used in particular in connection with the sputtering technique for the coating of substrates. A particular advantage of the materials of the invention is that, relative to the customary indium tin oxide materials, substantially lower temperatures are required for the shaping of the mouldings. The mouldings produced in accordance with the invention find application as components or functional elements for conductive systems in optoelectronics and microelectronics or as an ITO source in sputtering installations.

As mentioned, the ITO materials prepared in accordance with the invention may be used for coating purposes, in which case one or more binders may be present in the ITO material. The techniques suitable for coating are those which are conventional and known to the person skilled in the art. Examples thereof are dipping, spraying, knife coating, spreading, brushing and spin coating. Suitable coating substrates are those of any desired materials, such as plastic, metal, glass, semiconductor (e.g. silicon wafer) or ceramic, for example. The ITO layers may be used for IR blocking and for antistatic treatment. The IR blocking may take place, for example, by IR absorption or by IR reflection.

The ITO materials prepared in accordance with the invention are preferably employed as coating materials in optoelectronics and microelectronics, or for optical (transparent) IR-blocking or conductive coatings. They may also be used for screen printing pastes. They may be used with preference, for example, for transparent driver electrodes for liquid-crystal displays, thinfilm electroluminescent displays, electrochromic displays, transparent conductive layers for highly sensitive radiation selectors, ferroelectric photoconductors, memory systems, transparent conductive oxide films as gate electrodes for charge, injection and charge-coupled systems, and also for preparing printing pastes suitable for printing glass, ceramic and plastics, for shielding electromagnetic waves, for IR-reflecting layers and plastics, conductive electrodes for solar cells, or antistatic films, for television screens, monitors and contact screens, for example.

Further possibilities for employing the ITO materials of the invention include their use for plastic glass, IR barriers for projectors, IR barriers after lamps, IR-absorbing coatings, heat protection screens (e.g. as the coating on glass screens for baking ovens), solar collectors, coats on heat exchangers, and transparent thermal radiation absorbers on metals, glass, ceramics and plastics, such as antidew/antimist coatings on all substrates and articles (e.g. vehicles, windows, facades, instruments, traffic signs, notice boards and windows of cooling installations).

The examples which follow illustrate the invention without restricting it.

EXAMPLES

1. Preparation of an ITO Suspension and an ITO Powder
a) Preparation of the Precursor InO (OH)
   140 g of indium(+III) chloride (0.63 mol anhydrous)
   18 g of tin(+IV) chloride×5 $H_2O$
   5.6 g of caprolactam
are introduced into 1400 ml of water and stirred. After a clear solution has formed, it is heated to 50° C. After this temperature has been reached, 105 ml of ammonium hydroxide solution (25% strength) are added dropwise with vigorous stirring. The suspension is stirred at a temperature of 50° C. for a further 24 hours. For complete precipitation, a further 280 ml of ammonium hydroxide solution are subsequently added to the mixture. A white precipitate of indium oxide hydroxide is formed, which is centrifuged off (30 min at 4000 rpm). The powder is dried at 190° C. in a vacuum drying cabinet until slight yellowing of the powder is observed (transition to crystalline indium oxide).

b) Aftertreatment of the Dried Indium Oxide Hydroxide

The dried powder is finely mortared, distributed in crystallizing dishes and placed in a forming gas oven. The oven is evacuated, then flooded with nitrogen. The oven is heated to 250° C. with a heating rate of 250° C./hour and with a nitrogen flow rate of 200 liters/hour. This temperature is maintained for 60 minutes under forming g as atmosphere with a gas flow rate of 300 liters/hour. Thereafter, the oven cools down under nitrogen atmosphere until it reaches room temperature (duration: approximately 5 hours). This results in a dark blue powder which was identifiable as pure indium oxide phase by means of X-ray analysis.

c) Workup of the Indium Oxide Powder

Variant 1

A mortar mill is charged with 25 g of a mixture of 50% by weight ethylene glycol, 50% by weight diethylene glycol monobutyl ether (alternatively, diethylene glycol can be used instead of ethylene glycol, and/or dibutylene glycol ethers can be used instead of diethylene glycol monobutyl ether), and 5.6 g of 3,6,9-trioxadecanoic acid. 75 g of ITO powder prepared in accordance with the invention are added slowly, and milling is carried out for 1 or 2 hours. This results in a dark blue suspension of high viscosity which is homogenized on a roller bed for approximately 20 minutes. The resulting suspension is redispersed in ethanol by introducing 43 g of the suspension thus obtained into 57 g of ethanol and stirring.

Separation of the ethanol produces ITO powders which are redispersible in ethanol to a particle size of less than 20 nm. The primary particle size is 10 to 11 nm, the specific surface area 70 m$^2$/g. Isoelectric point: 7.2. The tin content is usually 8 mol %. From these powders it is possible to apply sol-gel layers which, at a film thickness of 400 nm with a baking temperature of 550° C., are able on glass to realize a transmission >90% and a surface resistance of 160 Ω/□. It is possible to apply two or more layers, in which case the surface resistance is further reduced. Thus the surface resistance obtained with a double layer (600 nm layer thickness) is just 100 Ω/□.

Variant 2

A mortar mill is charged with 25 g of ethanol (or butanol) and 5.6 g of 3,6,9-trioxadecanoic acid. 75 g of ITO powder prepared in accordance with the invention are slowly added and milling is carried out for 2 h. This results in a dark blue suspension of high viscosity which is homogenized on a roller bed for approximately 20 minutes. The ITO suspension thus obtained is diluted with 144.4 g of ethanol and stirred.

Both variants give an ITO suspension containing 30% by weight ITO and, respectively, 5.4% by volume nanoparticles in ethanol. The suspension is used for coating purposes (see above).

Variant 3

A roll-type kneading apparatus is charged with 30 g of ethanol (or butanol or a 50/50 ethylene glycol/diethylene glycol monobutyl ether mixture) and 7.2 g of 3,6,9-trioxadecanoic acid. Under kneading conditions, 5×20 g of ITO powder are added and the mixture is homogenized for 30 minutes. This gives a dark blue liquid suspension of high viscosity, having a solids content of up to 80% by weight (corresponding to 38% by volume). This suspension is dispersed in ethanol by adding 40 g of the suspension thus obtained to 70 g of ethanol and stirring (solids content 4.6% by volume).

2. Production of a Target from Inventive ITO Material

In this example, targets as an ITO source in sputtering units are produced by electrophoretic deposition. The deposition cell used for this purpose comprises two opposed circular, planar, polished electrodes having a useful diameter of 25 mm, between which the suspension is located. The deposition electrode comprises vitreous carbon and the counterelectrode comprises stainless steel.

Systematic electrophoretic deposition experiments from the ethanolic ITO suspension (prepared in accordance with variant 1 above) with a solids content of 30% by weight or 5.4% by volume were conducted as a function of the deposition time (15–60 min) and the deposition field strength (30–180 V/cm). The mass of the green bodies that is deposited on the deposition electrode grows linearly with the applied field strength and with the deposition time. The mass deposited, standardized to the field strength (V/cm) and to the deposition time (min), is approximately $3 \cdot 10^{-3}$ g·cm/min·V. This corresponds to a standardized body formation rate (cm/min) of approximately $2.4 \cdot 10^{-4}$ cm·cm/min·V. Thus, with a deposition field strength of 30 V/cm and a deposition time of 60 minutes, a green body with a thickness of 4.3 mm is deposited. Following deposition and separation of the ITO green body from the deposition electrode, compact green bodies were obtained which can be dried without cracks. The dried ITO green bodies have green densities of 40% of the theoretical density.

Sintering experiments in atmospheric ovens with encapsulated ITO mouldings (green bodies; $Al_2O_3$ capsules) were conducted without applying pressure, in the temperature range of 1400–1600° C. As the sintering temperature goes up, increasing thermal densification is obtained. After a sintering period of 6 h at 1600° C., a density of 97% of the theoretical density is obtained.

3. Preparation of a Coating Composition from Inventive ITO Material a) Preparation of a boehmite sol (in accordance with DE-A-4338361):

34.06 g of 0.1 N HCl were added to 0.48 g of boehmite powder stabilized with acetic acid (6.4% by weight acetic acid). This gave a transparent colourless suspension which was used further directly for the preparation of the sol A.

b) Preparation of a sol A (in accordance with DE-A-4338361):

4.86 g of the above boehmite sol were added to a mixture of 23.63 g of glycidylpropyltrimethoxy-silane (GPTS) and 12.50 g of tetraethoxysilane (TEOS). The reaction mixture was stirred at room temperature for 2 hours and then 11.36 g of aluminium tributoxyethoxide were added with ice cooling. After the end of the addition, the mixture is stirred at 0° C. for 2 h more, after which 29.68 g of the above boehmite sol are added in portions.

c) Incorporation of the ITO nanoparticles:

A 40% by weight (=6.9% by volume) suspension of the ITO nanoparticles prepared in accordance with the invention (variant 1) in water (alternatively, ethanol or butanol for example, may be used) is mixed with the sol A and stirred at 25° C. for 12 h. The amounts of suspension and sol A used are guided by the desired ITO filling level (i.e., % by volume of ITO based on overall solids content) of the layers.

With 28.69 g of 40% by weight or 6.9% by volume ITO suspension and 10.00 g of sol A, for example, a coating having an ITO filling level of 80% by weight or 68% by volume is obtained.

d) Processing to layers:

Using the coating composition, polycarbonate, glass and vitreous silica are spin-coated. The substrates were treated beforehand with an Ar/$O_2$ plasma, but the treatment is not essential for the properties described below. The coated substrates are cured at 120–140° C. for 2–4 h in accordance with the provisions for the binder.

The FIGURE shows absorption spectra of glass with an ITO-free layer (plot 1) and also glass with an ITO-containing layer (80% by weight or 68% by volume ITO filling level) (plot 2) at 200 to 2700 nm. It can be seen that both layers are transparent and colourless in the visible range and that the ITO-containing layer absorbs in the NIR range.

What is claimed is:

1. A method of preparing a suspension or powder comprising indium tin oxide, comprising the steps of:
    (a) precipitating an indium tin oxide precursor from a solution containing at least one indium compound and at least one tin compound in at least one solvent in the presence of at least one surface-modifying component,
    (b) removing the solvent from the precursor, and then calcining the precursor to form a calcined powder,
    (c) adding at least one surface-modifying component and at least one solvent to the calcined powder to form a mixture,
    (d) comminuting or dispersing the mixture to form the suspension comprising indium tin oxide, and optionally
    (e) separating the liquid components from the suspension to form the powder comprising indium tin oxide.

2. The method of claim 1 where the at least one indium compound is selected from indium(III) chloride, indium(III) iodide, indium(I) chloride, indium(I) iodide, indium(III) nitrate, indium(III) acetate, indium(III) sulphate, an indium (III) alkoxide, and mixtures thereof, and the at least one tin compound is selected tin (IV) chloride, tin (II) chloride, tin(IV) sulphate, tin(II) sulphate, a tin(IV) alkoxide, a tin(II) alkoxides, and mixtures thereof.

3. The method of claim 1 where the at least one surface-modifying component used during at least one of step (a) and step (c) is selected from monocarboxylic acids, polycarboxylic acids, diketones, amino acids, polyethylene oxide derivatives, amines, acid amides, and mixtures thereof.

4. The method of claim 3 where the at least one surface-modifying component is selected from 3,6,9-trioxadecanoic acid, β-alanine, polyoxyethylene(20) sorbitan monooleate, caprolactam, and mixtures thereof.

5. The method of claim 1 where a base is used to precipitate the indium tin oxide precursor.

6. The method of claim 1 where the calcining is conducted at 200° C. to 400° C.

7. The method of claim 1 where the calcining is conducted under reducing conditions or where the calcining is followed by a reduction.

8. The method of claim 1 where the comminuting or dispersing is conducted in a high-boiling solvent.

9. The method of claim 8 where the high-boiling solvent is diethylene glycol or diethylene glycol monobutyl ether.

10. A suspension or powder comprising indium tin oxide prepared by the method of claim 1.

11. The method of claim 1 comprising processing the suspension or the powder comprising indium tin oxide into a moulding.

12. A coating composition or moulding composition comprising a suspension or powder of claim 10.

13. A non-sintered moulding comprising indium tin oxide prepared by the method of claim 11.

* * * * *